(12) United States Patent
Gilliland et al.

(10) Patent No.: US 8,804,374 B2
(45) Date of Patent: Aug. 12, 2014

(54) ELECTROMAGNETIC INTERFERENCE SHIELD

(75) Inventors: Don A. Gilliland, Rochester, MN (US); David B. Johnson, Rochester, MN (US); Timothy L. McMillan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 13/271,775

(22) Filed: Oct. 12, 2011

(65) Prior Publication Data

US 2013/0094170 A1 Apr. 18, 2013

(51) Int. Cl.
*H05K 9/00* (2006.01)
*H02G 3/14* (2006.01)
*H05K 5/03* (2006.01)

(52) U.S. Cl.
USPC ................ 361/818; 361/816; 174/66; 174/67

(58) Field of Classification Search
USPC ......... 174/66, 67, 53; 220/241; 361/816, 817, 361/818; 439/676
See application file for complete search history.

(56) References Cited

U.S. PATENT DOCUMENTS

| | | | |
|---|---|---|---|
| 5,698,818 A | 12/1997 | Brench | |
| 5,895,885 A | 4/1999 | Kunkel | |
| 6,018,125 A | 1/2000 | Collins et al. | |
| 6,163,454 A | 12/2000 | Strickler | |
| 6,297,446 B1 | 10/2001 | Cherniski et al. | |
| 6,838,613 B2 | 1/2005 | Kopf | |
| 7,135,644 B1 | 11/2006 | Gilliland et al. | |
| 7,390,976 B2 | 6/2008 | Liang et al. | |
| 7,442,882 B2 | 10/2008 | Gilliland et al. | |
| 7,492,610 B2 | 2/2009 | Gilliland | |
| 7,909,902 B2 | 3/2011 | Eckberg et al. | |
| 8,283,562 B2 * | 10/2012 | Clifton et al. | 174/59 |
| 2002/0028055 A1 * | 3/2002 | Shibutani et al. | 385/134 |
| 2007/0272438 A1 | 11/2007 | Gilliland et al. | |
| 2009/0308033 A1 | 12/2009 | Eckberg et al. | |
| 2009/0321448 A1 * | 12/2009 | Provenzano et al. | 220/241 |
| 2010/0261378 A1 * | 10/2010 | Davison et al. | 439/540.1 |

* cited by examiner

*Primary Examiner* — Hoa C Nguyen
*Assistant Examiner* — Binh Tran
(74) *Attorney, Agent, or Firm* — Jason H. Sosa

(57) ABSTRACT

An electromagnetic interference (EMI) shield that increases the airflow through the EMI shield while preventing line-of-sight openings through the EMI shield. Two plates are coupled together. Each of the respective plates has a raised component with an aperture therethrough to provide a path through the plate. The raised component is preferably scoop-shaped with the aperture at one end and an opposite end tapering into the respective plate. At least a portion of one of the raised components overlaps at least a portion of the other of the raised components when the plates are coupled together to form a path through the plates, while the plates are coupled together. Line-of-sight openings through the plates, to an electronic device protected by the EMI shield, are at least partially prevented by the raised components.

12 Claims, 6 Drawing Sheets

ELECTROMAGNETIC INTERFERENCE SHIELD

FIELD OF THE INVENTION

This disclosure relates generally to shielding electronic devices from electromagnetic interference (EMI), and in particular, to systems which balance electromagnetic shielding with sufficient air flow.

BACKGROUND OF THE INVENTION

For purposes of this disclosure, the term electromagnetic interference (EMI) is understood to refer to electromagnetic emission and radiation that includes both electromagnetic interference and radio-frequency interference (RFI). Both of these types of interference generate electromagnetic fields that can interfere with the operation of adjacent electrical equipment. It is desirable to protect electronic devices from external EMI, and also to prevent internal EMI from escaping and possibly interfering with other electronic devices in the vicinity. To accomplish this, EMI shields are often used in enclosures containing electronic equipment, components, and/or circuitry (e.g., computers and test equipment).

A solid EMI shield provides highly efficient EMI attenuation. However, electronic devices generate high levels of heat that must be dissipated for continued effective operation of the electronic devices. It is known for EMI shields to have holes (i.e., a perforated plate) allowing airflow to and from a contained electronic device. Generally, the larger the free-area coefficient, i.e., the ratio of open area or holes to total area of an EMI shield, the lower the airflow impedance caused by the EMI shield at a given flow rate. While more airflow, and hence efficient cooling, is achieved with greater open areas, the effectiveness of an EMI shield tends to decrease as open area increases.

To achieve a greater balance between effective electromagnetic shielding and sufficient airflow, various techniques have been used. For example, the shape of the holes in a perforated plate may be changed from a circle to a polygonal shape, such as a square or hexagon. The size of the holes may be varied, as well as the distance between holes and/or the patterns of holes used. The thickness of the plate may also be increased. Another known technique involves the use of two plates where larger holes are used on each individual plate to allow for greater airflow, but the plates are offset so that there are less open straight paths (line-of-sight) for electromagnetic frequencies to enter or escape.

Ultimately, each opening providing line-of-sight to the electronic device should be sized to a diameter that is small compared to the wavelength of the highest frequency to be shielded. Generally, the faster the device is, the higher the electromagnetic frequency (e.g., the shorter the resulting EMI radiation wavelength). Faster devices concurrently produce more heat. Electronic devices continue to increase in speed, so just as EMI shielding needs to be improved, e.g., smaller holes, airflow also needs to be increased, e.g., larger holes.

SUMMARY

One aspect of an embodiment of the present invention discloses an apparatus for electromagnetic shielding. The apparatus comprises a first plate comprising a first front face and a first back face, and a first raised component on the first front face with an aperture therethrough providing a path through the first plate. The apparatus further comprises a second plate comprising a second front face and a second back face, and a second raised component on the second front face with an aperture therethrough providing a path through the second plate. The first back face is coupled to the second back face, wherein at least a portion of the first raised component overlaps with at least a portion of the second raised component to provide a path through both plates via the aperture of the first raised component and the aperture of the second raised component.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Figure 1:
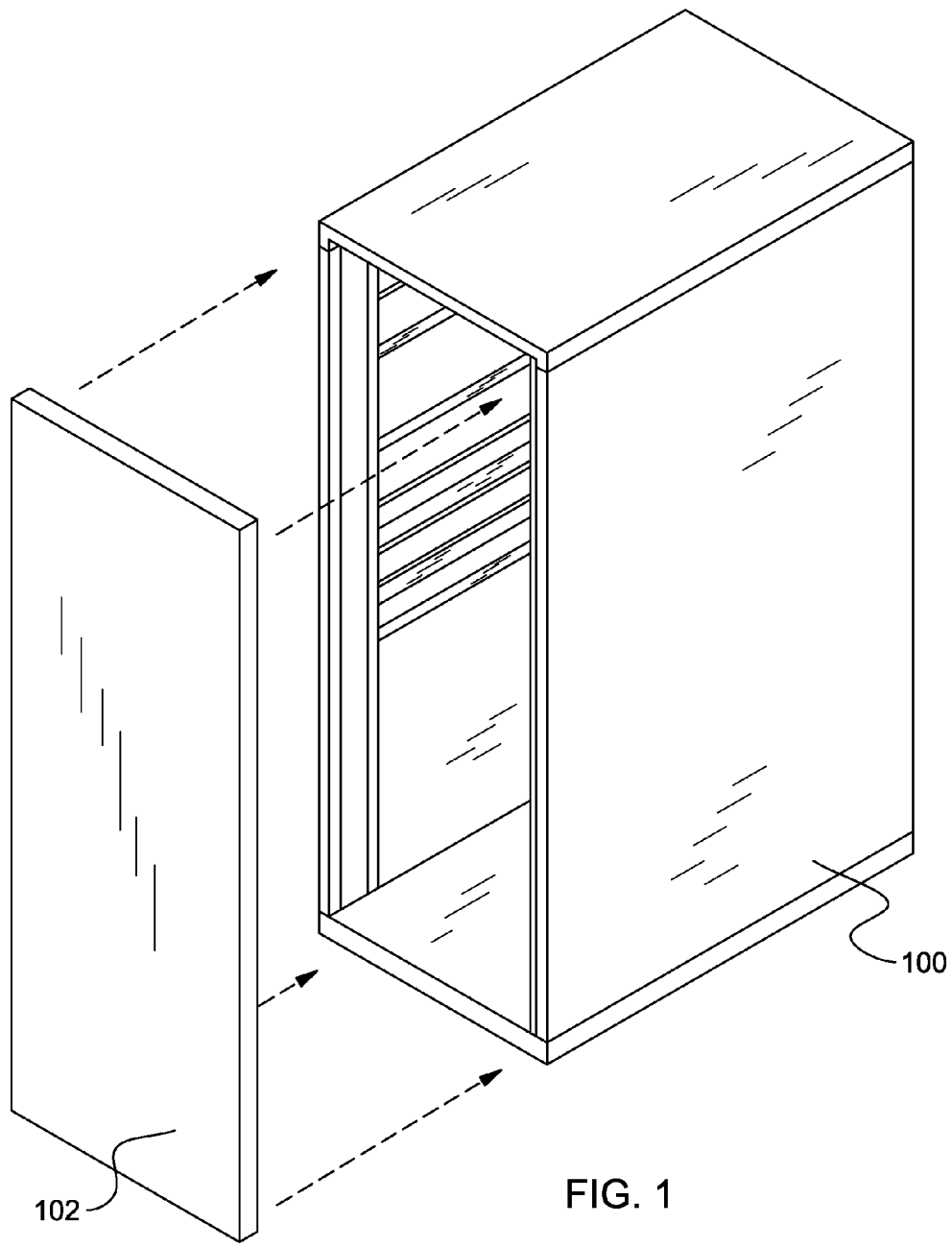
FIG. 1 depicts an electronic device enclosure in accordance with an embodiment of the present invention.

FIG. 1 depicts an electronic device enclosure in accordance with an embodiment of the present invention. In one embodiment, enclosure 100 is a server rack. In another embodiment, enclosure 100 is a computer tower. In other embodiments, enclosure 100 is any enclosure designed to contain various electronic devices or components that generate at least one of heat or electromagnetic radiation during operation. Enclosure 100 is preferably composed of a metal or other conducting material and preferably forms a large portion of a Faraday cage to block electric fields and electromagnetic radiation. Enclosure 100 preferably contains a minimal amount of openings. EMI shield 102 may complete the Faraday cage and is also preferably composed of a metal. EMI shield 102 is designed to purposefully have one or more openings to allow for airflow into and out of enclosure 100. The various embodiments of the present invention describe design and structure of EMI shield 102 and the one or more openings through EMI shield 102. EMI shield 102 may be adhesively or mechanically attached to enclosure 100 (e.g., screwed or bolted, welded, hinged, etc.). In another embodiment, EMI shield 102 is cast with enclosure 100.

Figure 2:
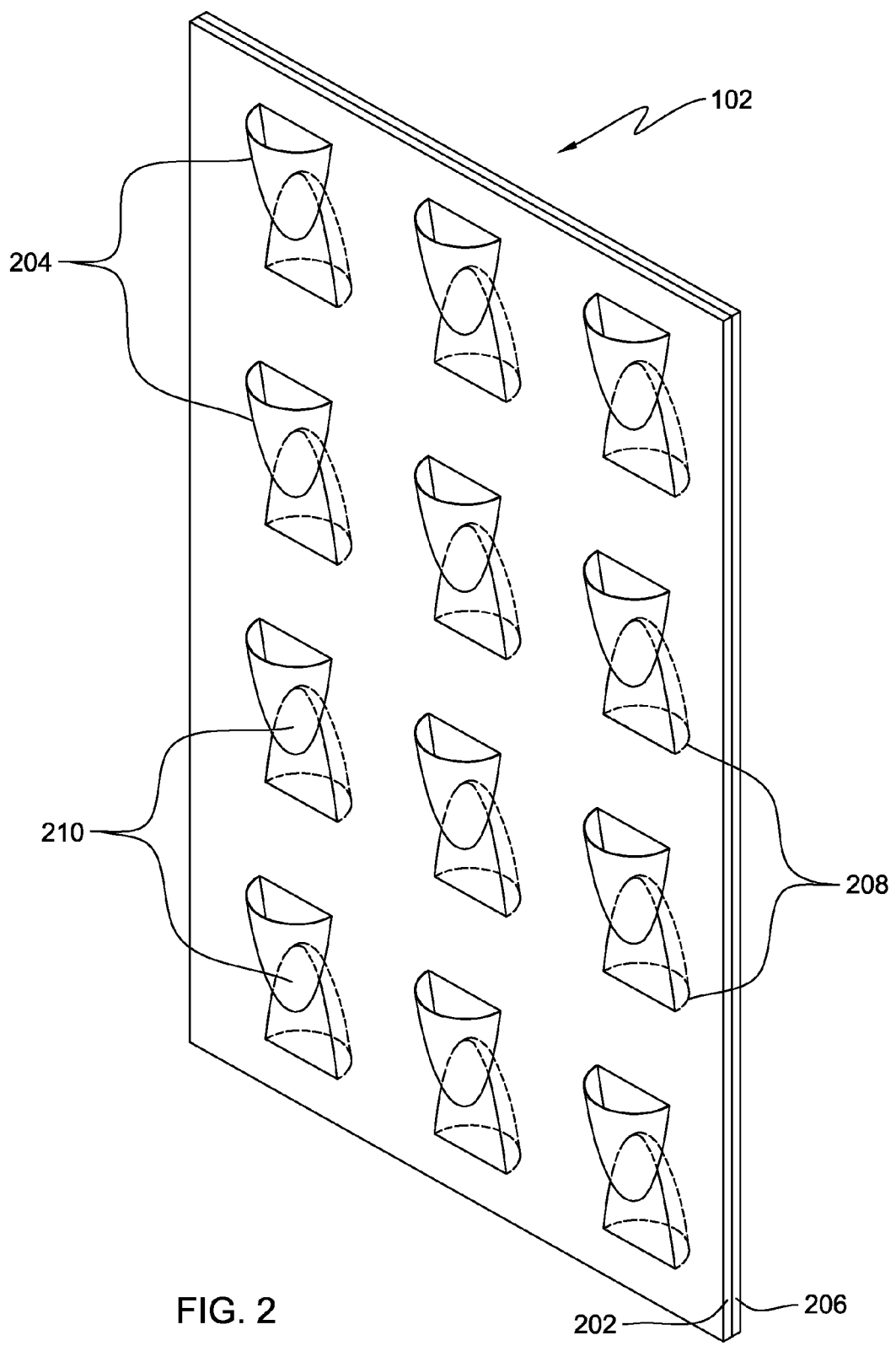
FIG. 2 depicts an EMI shield in accordance with one embodiment of the present invention.

FIG. 2 depicts EMI shield 102 in accordance with one embodiment of the present invention.

EMI shield 102 comprises plate 202 adjoining plate 206. Both plates 202 and 206 are preferably metal. Plate 202 includes at least one raised "scoop" 204 and plate 206 contains at least one raised scoop 208. The term "scoop" is used to describe a raised component on a plate with a hole or opening somewhere on the raised component that allows air to flow through the plate. In a preferred embodiment, each of scoops 204 and 208 has an opening at one end and tapers into its respective plate 202 or 206 at the other end to form a scoop-shaped hood or cowl that covers an opening in the plate. As an analogy, the shape may be similar to a raised curved opening of a cheese grater or a hood scoop for a car (an upraised component on the hood of a car having an opening at the end towards the front of the car and closed on all other sides). In geometric terms, a scoop may be described as a portion of an elliptic parabaloid or a portion of a prism. In another embodiment, the respective openings of scoops 204 and 208 form half-hexagons. In other embodiments, scoops 204 and 208 may comprise any number of shapes. It should be appreciated that plates 202 and 206 generally include multiple scoops 204 and multiple scoops 208, respectively.

Plates 202 and 206 are adjoined back-to-back (i.e., so that the scoops 204 and 208 are raised opposite each other and away from the adjoining faces). Plates 202 and 206 are positioned so that at least a portion of scoop 204 overlaps at least a portion of scoop 208. In a preferred embodiment, the opening in scoop 204 faces an opposite direction than the opening in scoop 208 and the respective overlapping portions of scoop 204 and 208 are the back or tapered ends opposite the respective openings. The overlapping portions form intersection 210 which provides a path through plates 202 and 206 via scoops 204 and 208.

A person having ordinary skill in the art will recognize that, in an alternate embodiment, plates 202 and 206 may be formed as a single plate with scoops 204 and 208 formed on opposite faces of the single plate.

In any embodiment, scoops 204 and 208 are oriented so that there is no line-of-sight opening through plates 202 and 206 orthogonal to plates 202 and 206. In this manner, larger openings may be used, increasing airflow to enclosure 100, but without concurrently increasing the ranges of interference frequencies that can pass through EMI shield 102.

Figure 3:
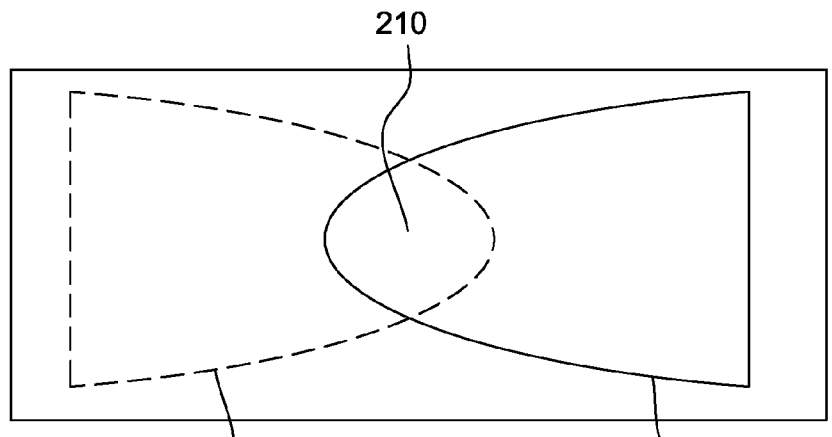
FIG. 3 depicts the preferred alignment of scoops on back-to-back plates of the EMI shield of FIG. 2.

FIG. 3 depicts the preferred alignment of scoops 204 and 208. Scoop 208 is the inverse of scoop 204 (flipped and rotated) and intersection 210 is the overlapping of the back ends. Intersection 210 forms a lemon shaped hole through plates 202 and 206 and may be adjusted in size.

Figure 4:
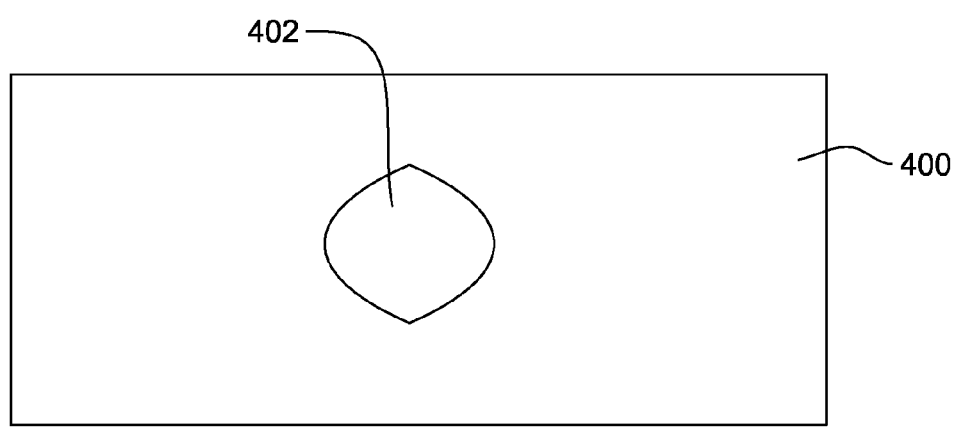
FIG. 4 depicts an intermediate layer between the back-to-back plates, in accordance with an embodiment of the present invention.

FIG. 4 depicts an intermediate layer between plate 202 and plate 206, in accordance with an embodiment of the present invention. Layer 400 is an absorption layer comprised of EMI absorbing materials and placed in between plate 202 and plate 206. In a preferred embodiment, layer 400 contains aperture 402, a hole the same size or slightly larger than intersection 210. Aperture 402 is oriented to fit around the hole created at intersection 210. EMI absorbing materials may be dielectric or magnetic, uniform or nonuniform, chiral or nonchiral, and natural or synthetic in various embodiments. Layer 400 may be plated on to the back face of one or both of plates 202 and 206, adhesively attached, or mechanically attached. In another embodiment, layer 400 is a foam that also performs an adhesive function to adjoin plates 202 and 206.

Figure 5:
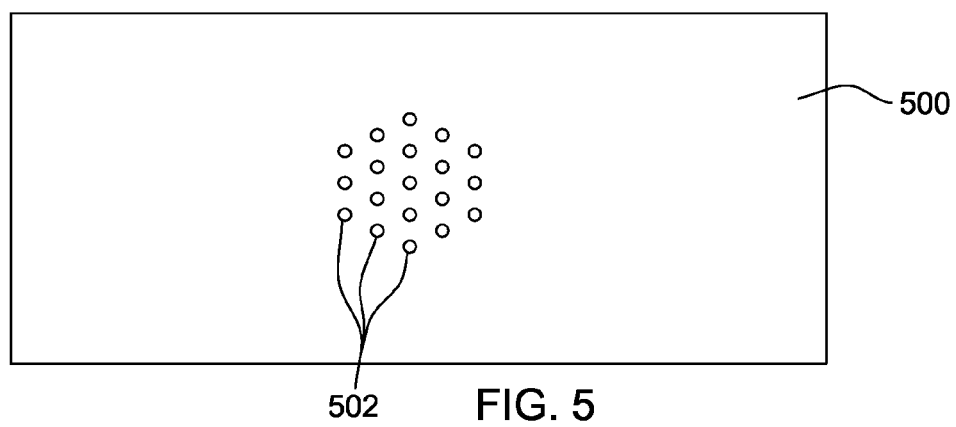
FIG. 5 depicts an alternate or additional intermediate layer between the back-to-back plates, in accordance with an embodiment of the present invention.

FIG. 5 depicts another intermediate layer between plate 202 and plate 206, in accordance with an embodiment of the present invention. Layer 500 may be used as an alternative, or an addition to, layer 400. Layer 500 fits between plate 202 and plate 206 and comprises a plurality of small holes 502 that are oriented to fit in the region of intersection 210. Small holes 502 may help to further attenuate EMI. Layer 500 is preferably composed of a metal. In another embodiment, layer 500 is composed of an EMI absorbent material.

Figure 6:
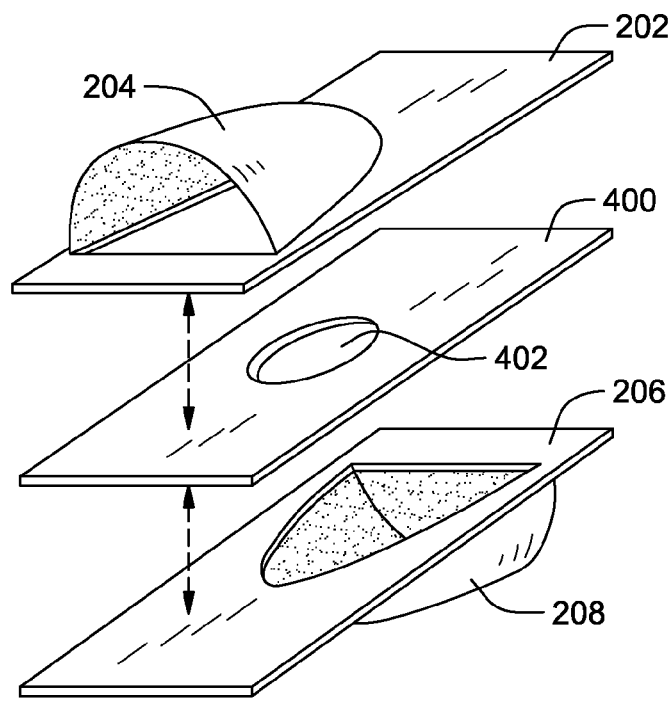
FIG. 6 depicts a view of the intermediate layer of FIG. 4 oriented between the back-to-back plates in accordance with an embodiment of the present invention.

FIG. 6 depicts a view of intermediate layer 400 oriented between plate 202 and 206 in accordance with an embodiment of the present invention.

Figure 7:
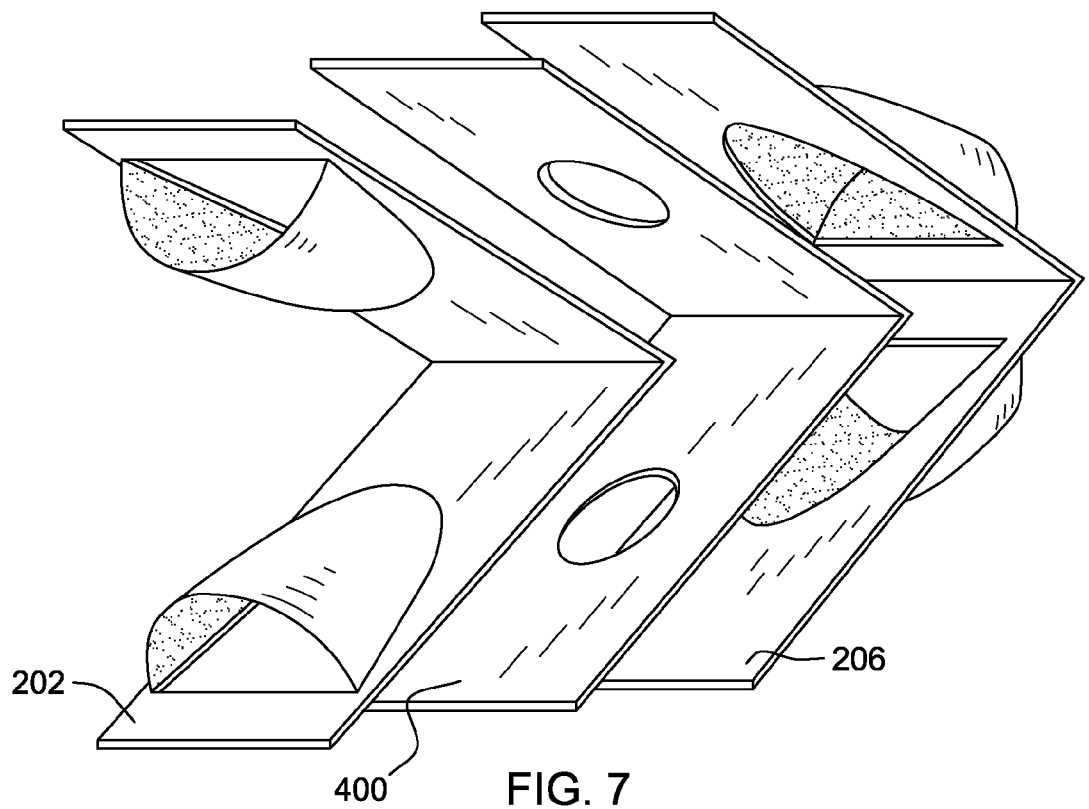
FIG. 7 depicts the back-to-back plates folded between paired scoops, in accordance with an embodiment of the present invention.

FIG. 7 depicts folded plates 202 and 206 in accordance with another embodiment of the present invention. In between pairs of overlapping scoops 204 and 208, plates 202 and 206 may be folded to orient the paired scoops at an alternate angle. Layer 400 may again be inserted between the plates. It is to be understood that as an alternative to physically folding the plate layers, separate plate sections may be welded or hinged together in various embodiments.

Figure 8:
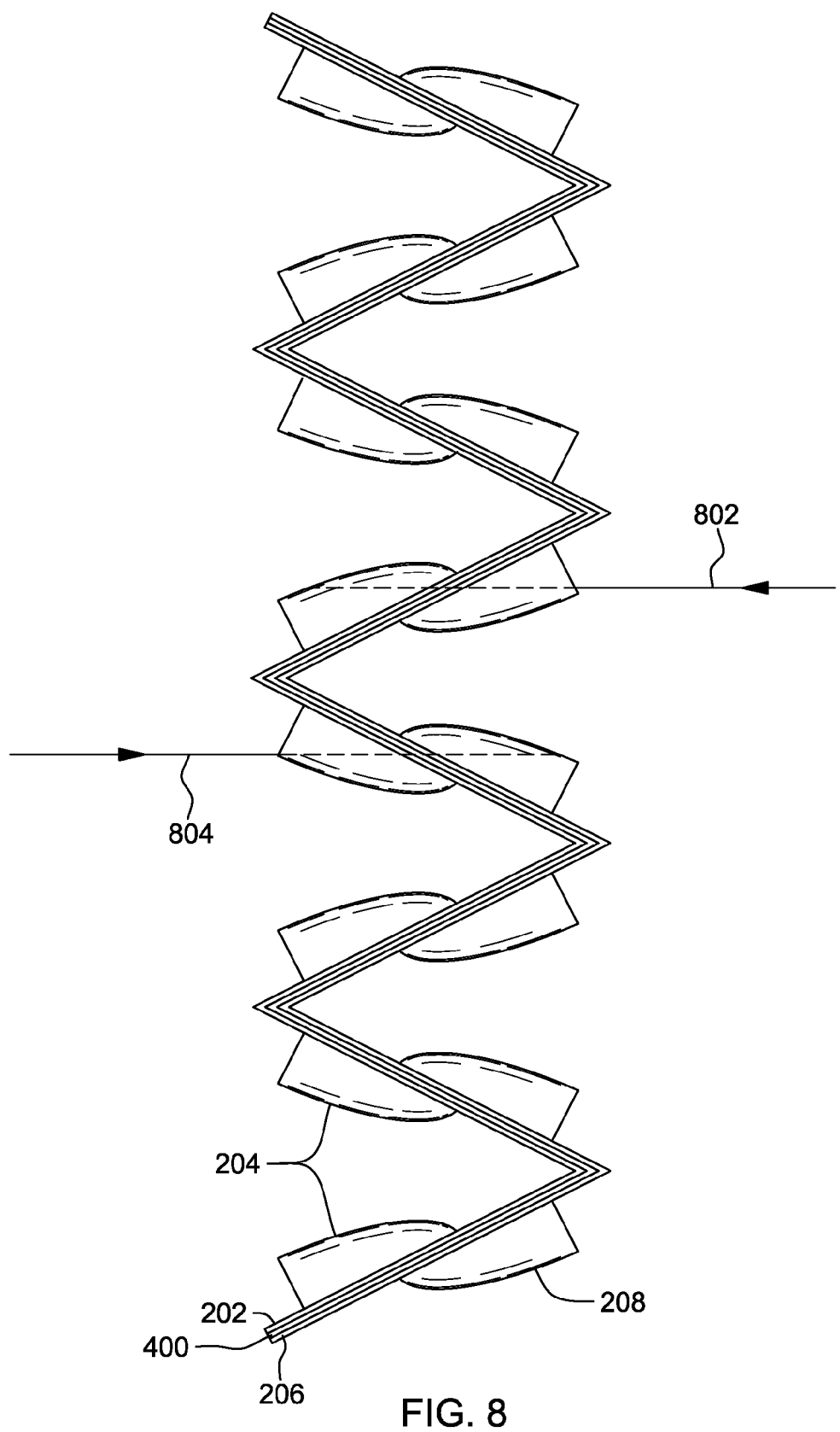
FIG. 8 extrapolates the folded plated orientation as depicted in FIG. 7 to present a side view of the EMI shield utilizing such an orientation, in accordance with an embodiment of the present invention.

FIG. 8 extrapolates the folded plated orientation as depicted in FIG. 7 to present a side view of EMI shield 102 utilizing such an orientation, in accordance with an embodiment of the present invention.

It can be seen in FIG. 8 how the folded plate orientation allows increased air flow through plates 202 and 206 via scoops 204 and 208. However, as depicted, it can also be seen how the folded plate orientation may still prevent line-of-sight openings 802 and 804 orthogonal to the planar orientation of EMI shield 102.

Figure 9:
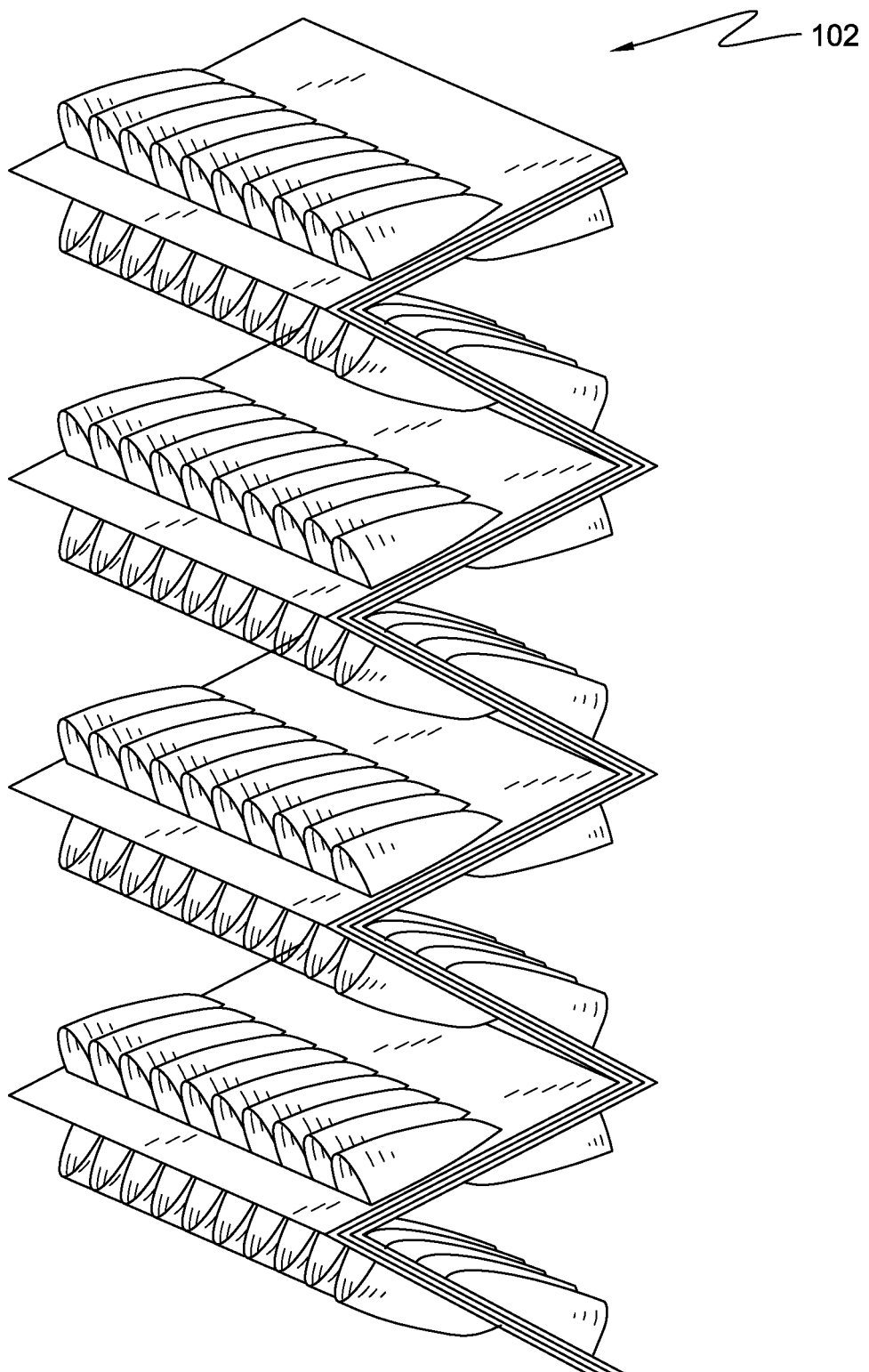
FIG. 9 depicts a full view of an EMI shield using the folded plate orientation.

FIG. 9 depicts a full view of EMI shield 102 using the folded plate orientation.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of an EMI shield (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for electromagnetic shielding, the apparatus comprising:
   a first plate comprising a first front face and a first back face, and a first raised component on the first front face with an aperture therethrough providing a path through the first plate and a second raised component on the first front face with an aperture therethrough providing a separate path through the first plate;
   a second plate comprising a second front face and a second back face, and a third raised component on the second front face with an aperture therethrough providing a path through the second plate and a fourth raised component on the second front face with an aperture therethrough providing a separate path the second plate; and
   the first back face coupled to the second back face, wherein at least a portion of the first raised component overlaps with at least a portion of the third raised component to provide a first path through both plates via the aperture of the first raised component and the aperture of the third raised component, and wherein at least a portion of the second raised component overlaps with at least a portion of the fourth raised component to provide a second path through both plates via the aperture of the second raised component and the aperture of the fourth raised component;

wherein the adjoined first and second plates are folded in between the overlapping first and third raised components and the overlapping second and fourth raised components, such that direct line-of-sight is maintained between the first and second raised components on the first plate and direct line-of-sight is at least partially prevented between the third and fourth raised components on the second plate by the folded adjoined first and second plates.

2. The apparatus of claim 1, wherein the first and third raised components block a direct path, orthogonal to an area of the first and second plates surrounding the first and third raised components, through the apertures of both the first and third raised components.

3. The apparatus of claim 1, wherein each of the first, second, third, and fourth raised components is scoop-shaped, with the aperture placed at one end of the respective first, second, third, or fourth raised component and an opposite end of the first, second, third, or fourth raised component tapering into the respective first or second plate, and wherein each of the first, second, third, and fourth raised components at least partially covers an aperture in the respective first and second plates.

4. The apparatus of claim 3, wherein a portion of the respective first, second, third, and fourth raised components comprises any number of sides between the one end and the tapered opposite end.

5. The apparatus of claim 1, wherein each of the first, second, third, and fourth raised components substantially form one of: a portion of an elliptic paraboloid, a portion of a cone, a portion of a quadrangle prism, and a portion of a hexagonal prism.

6. The apparatus of claim 3, wherein the aperture at the one end of the third raised component is oriented to face an opposite direction than the aperture at the one end of the first raised component.

7. The apparatus of claim 1, further comprising an intermediate layer between the first plate and the second plate.

8. The apparatus of claim 7, wherein the intermediate layer comprises an electromagnetic interference absorbent material.

9. The apparatus of claim 7, wherein the intermediate layer comprises an aperture that is the same size or larger than a hole formed by an overlap region of the first raised component and the third raised component, and is oriented to line up with the overlap region.

10. The apparatus of claim 7, wherein the intermediate layer comprises a number of apertures that are oriented to fit within an overlap region of the first raised component and the third raised component that makes-up at least part of the first path through the first and second plates.

11. The apparatus of claim 1, wherein the fold in the adjoined first and second plates is one of: a bend in the adjoined first and second plates at a desired angle, a mechanical attachment of separate sections of the adjoined first and second plates at the desired angle, and an adhesive attachment of separate sections of the adjoined first and second plates at the desired angle.

12. The apparatus of claim 1, wherein the fold is such that there is no line-of-site path orthogonal to a planar orientation of the apparatus through the apertures of the first and third raised components and no line-of-site path orthogonal to the planar orientation of the apparatus through the apertures of the second and fourth raised components.

* * * * *